US011936195B2

United States Patent
Na et al.

(10) Patent No.: US 11,936,195 B2
(45) Date of Patent: Mar. 19, 2024

(54) ELECTROMAGNETIC-INDUCTION POWER SUPPLY DEVICE

(71) Applicant: AMOSENSE CO., LTD, Cheonan-si (KR)

(72) Inventors: Wonsan Na, Seoul (KR); Jinpyo Park, Seoul (KR); Cheolseung Han, Seoul (KR)

(73) Assignee: AMOSENSE CO., LTD, Cheonan-si (KR)

( * ) Notice: Subject to any disclaimer, the term of this patent is extended or adjusted under 35 U.S.C. 154(b) by 392 days.

(21) Appl. No.: 17/274,938

(22) PCT Filed: Sep. 6, 2019

(86) PCT No.: PCT/KR2019/011590
§ 371 (c)(1),
(2) Date: Mar. 10, 2021

(87) PCT Pub. No.: WO2020/055050
PCT Pub. Date: Mar. 19, 2020

(65) Prior Publication Data
US 2022/0037922 A1 Feb. 3, 2022

(30) Foreign Application Priority Data
Sep. 12, 2018 (KR) .......... 10-2018-0109184

(51) Int. Cl.
*G01R 15/18* (2006.01)
*H02J 3/00* (2006.01)
(Continued)

(52) U.S. Cl.
CPC ............ *H02J 50/10* (2016.02); *G01R 15/186* (2013.01); *H02J 3/007* (2020.01); *H02J 7/02* (2013.01); *H02J 50/20* (2016.02); *H02J 2207/20* (2020.01)

(58) Field of Classification Search
CPC ........................................................ G05F 1/335
(Continued)

(56) References Cited

U.S. PATENT DOCUMENTS 9,673,694 B2   6/2017  Koo
10,923,274 B2  2/2021  Park et al.
(Continued)

FOREIGN PATENT DOCUMENTS

JP   2016-517256 A   6/2016
JP   2017-511101 A   4/2017
(Continued)

OTHER PUBLICATIONS

KR Office Action dated Aug. 5, 2020 as received in Application No. 10-2018-0109184.
(Continued)

*Primary Examiner* — Edward Tso
*Assistant Examiner* — Ahmed H Omar
(74) *Attorney, Agent, or Firm* — Maschoff Brennan

(57) ABSTRACT

An electromagnetic-induction supply device may comprise: a current transformer installed on a power line and including one or more coils, a first core, and a second core; and a breaker unit connected to at least one of the one or more coils, wherein the breaker unit forms a closed circuit with the at least one of the one or more coils to switch the current transformer to a short-circuit mode in which the first core and the second core can be separated. Therefore, when the electromagnetic-induction power supply device is brought close to or installed on a live power line, the breaker unit prevents the formation of a magnetic field and thus the electromagnetic-induction power supply device can be easily attached/detached to/from the power line.

5 Claims, 8 Drawing Sheets

(51) Int. Cl.
*H02J 7/02* (2016.01)
*H02J 50/10* (2016.01)
*H02J 50/20* (2016.01)

(58) Field of Classification Search
USPC .......................................................... 320/108
See application file for complete search history.

(56) References Cited

U.S. PATENT DOCUMENTS

| | | | |
|---|---|---|---|
| 10,923,951 B2 | 2/2021 | Na et al. | |
| 2003/0222747 A1* | 12/2003 | Perkinson | H01F 38/30 336/178 |
| 2011/0241629 A1* | 10/2011 | Jordan | H02M 3/07 320/166 |
| 2016/0005534 A1* | 1/2016 | Koo | H04B 5/0075 361/139 |
| 2017/0005525 A1 | 1/2017 | Lecias et al. | |
| 2019/0148979 A1* | 5/2019 | Goeldi | G01R 19/12 307/104 |
| 2019/0331083 A1* | 10/2019 | Nakamura | F02D 35/027 |

FOREIGN PATENT DOCUMENTS

| | | |
|---|---|---|
| KR | 10-2010-0090009 A | 8/2010 |
| KR | 10-1183294 B1 | 9/2012 |
| KR | 10-1695768 B1 | 1/2017 |
| KR | 10-2018-0015870 A | 2/2018 |
| KR | 10-2018-0016311 A | 2/2018 |
| KR | 10-2018-0043045 A | 4/2018 |

OTHER PUBLICATIONS

KR Decision to Grant dated Jan. 20, 2021 as received in Application No. 10-2018-0109184.
JP Office Action in Application No. No. 2021-513970 dated Apr. 19, 2022.

* cited by examiner

[FIG. 1]
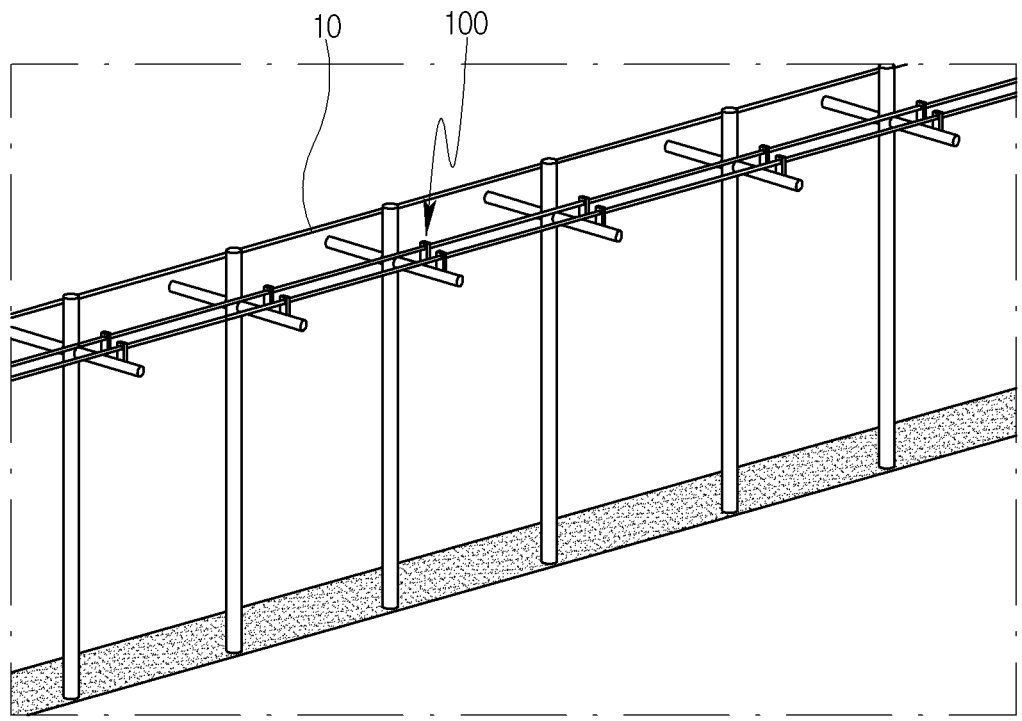

[FIG. 2]
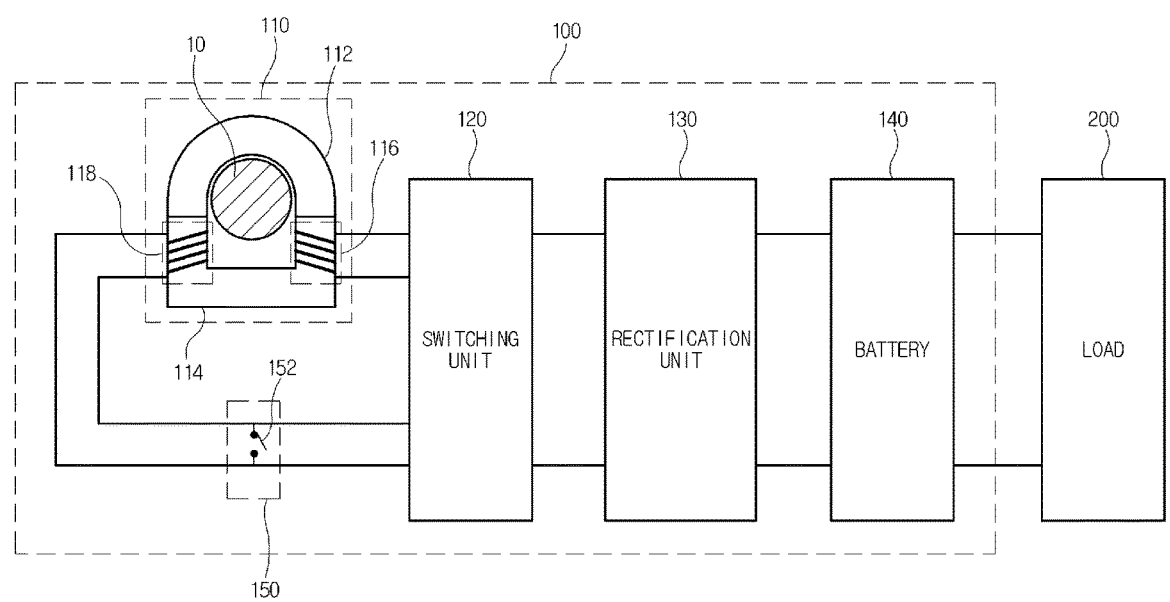

[FIG. 3]
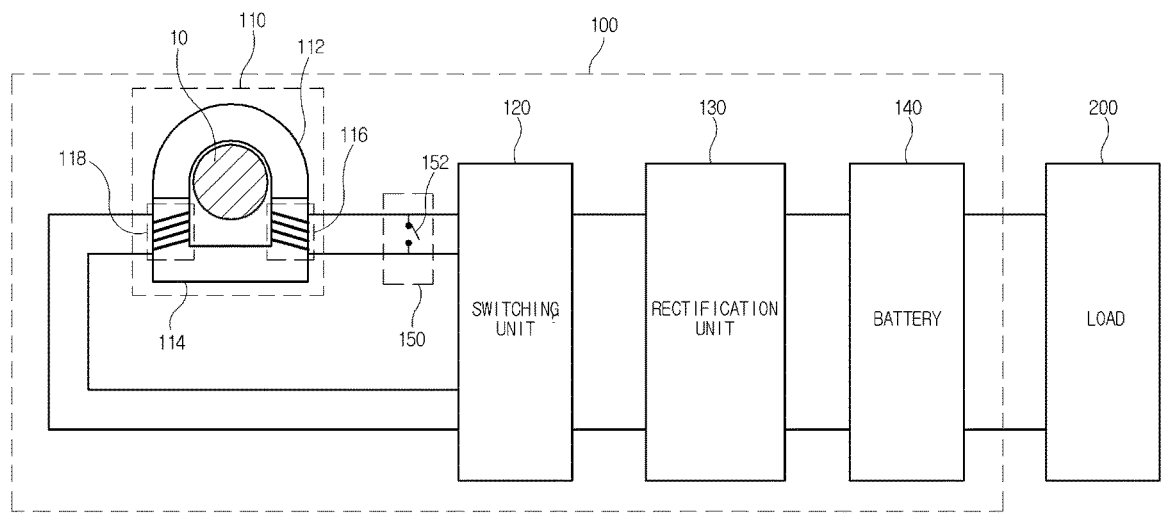

[FIG. 4]
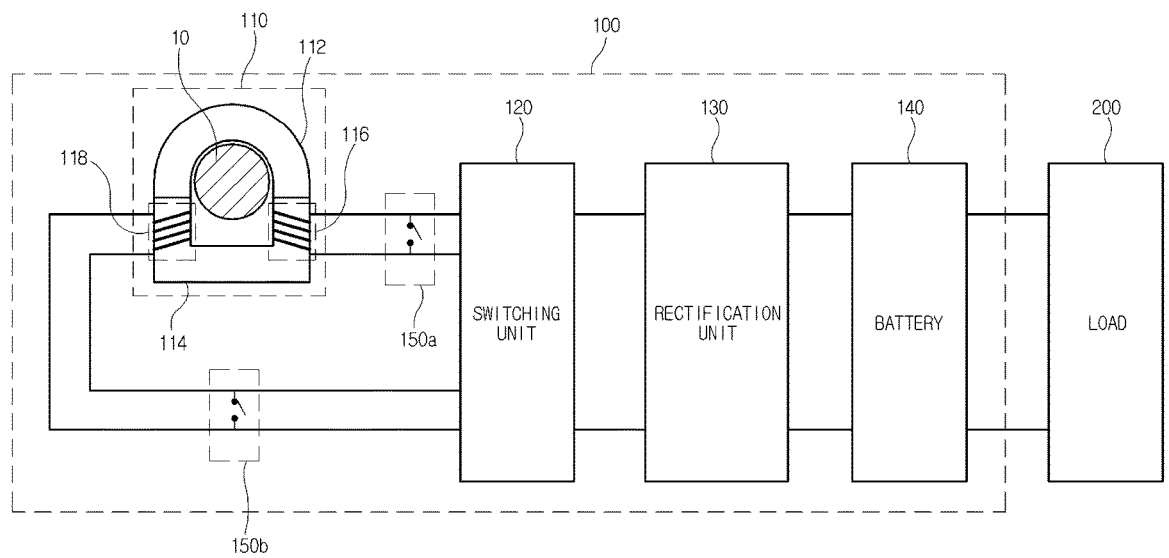

[FIG. 5]
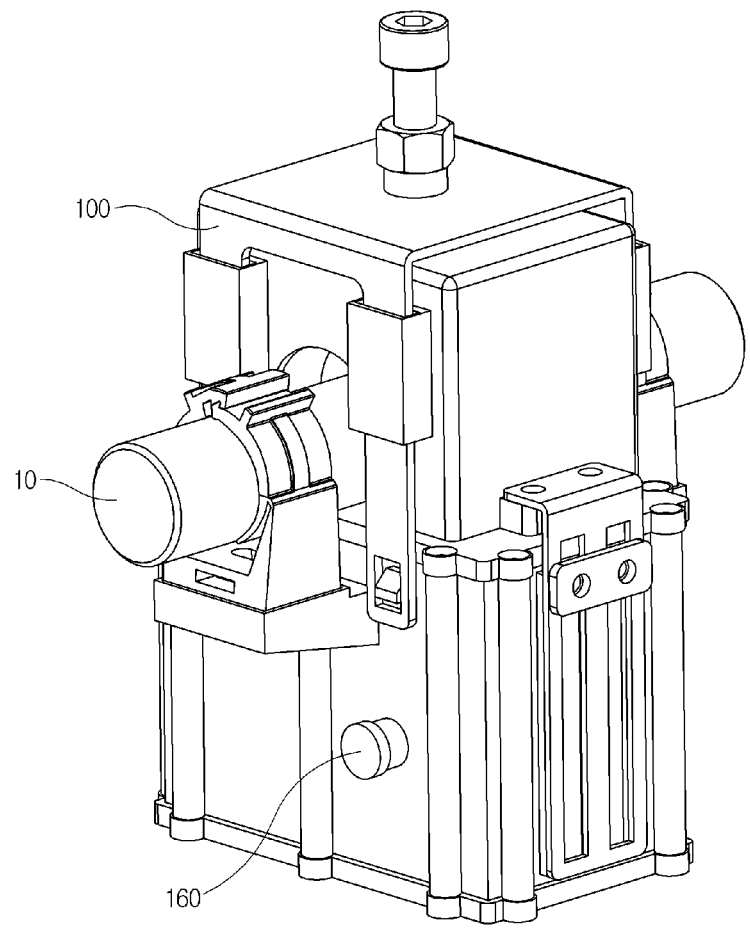

[FIG. 6]
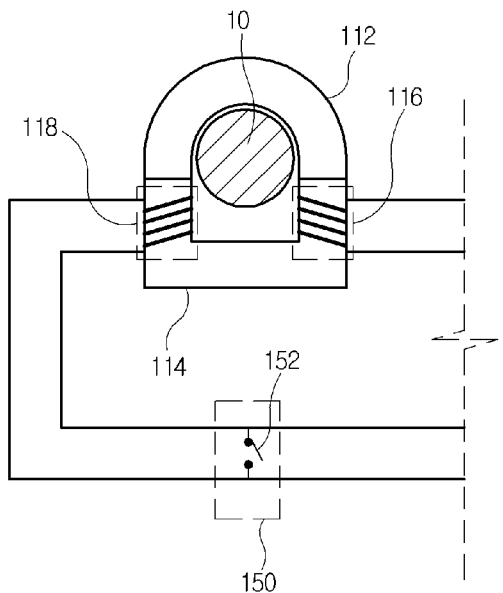
[FIG. 7]
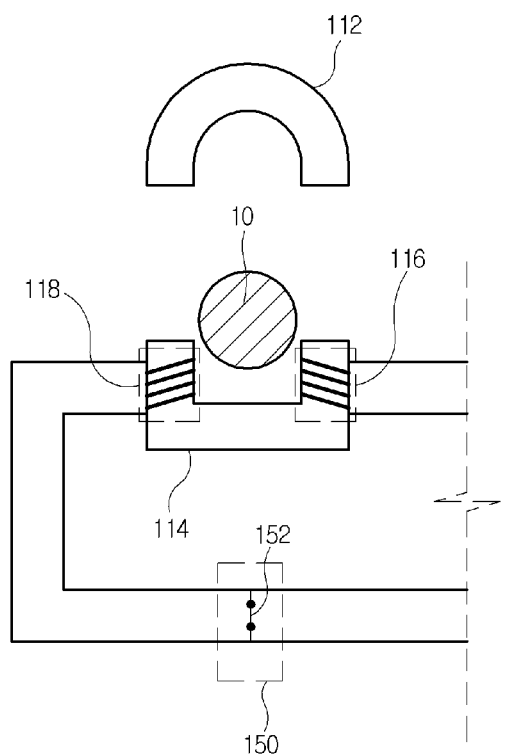

[FIG. 8]
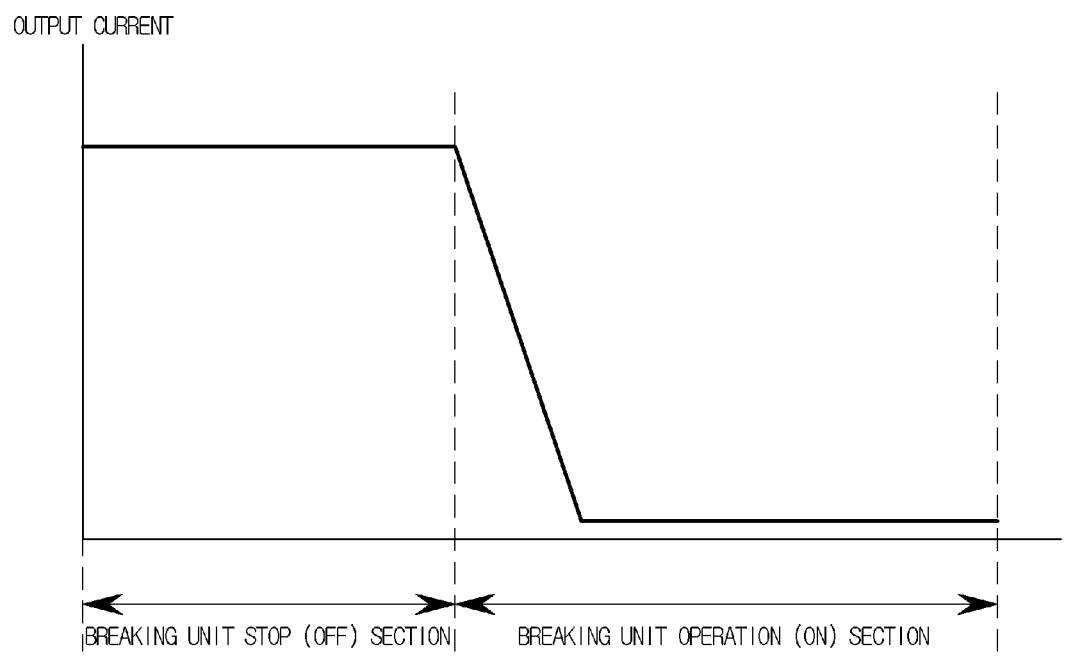

[FIG. 9]
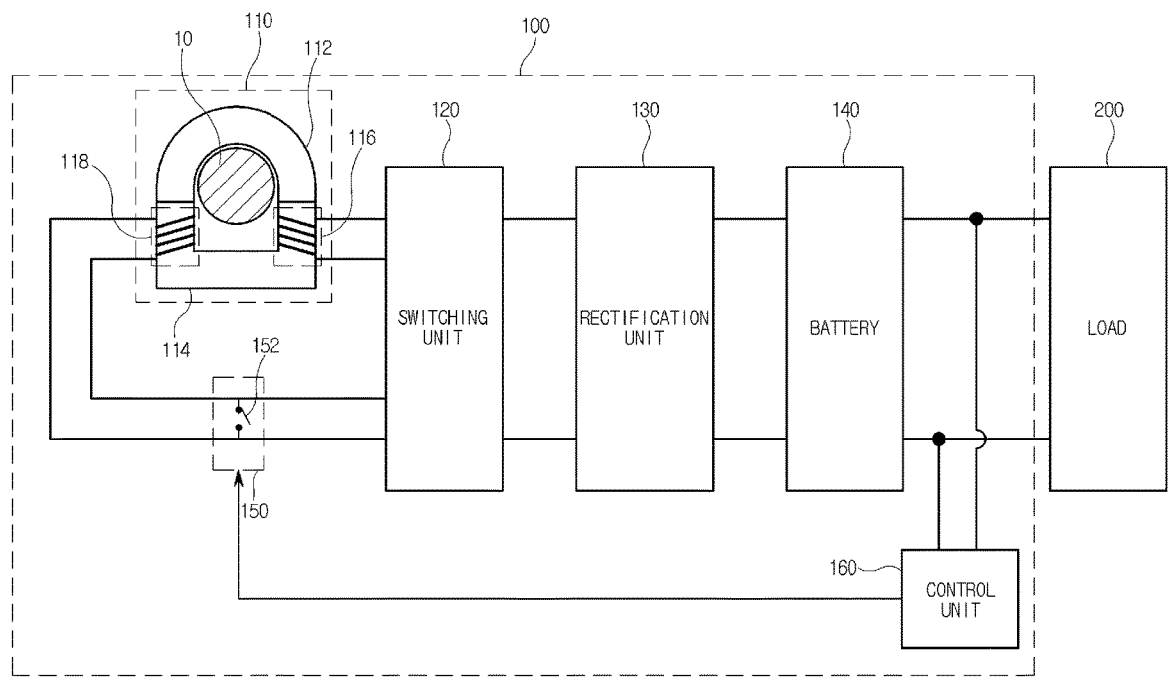

ELECTROMAGNETIC-INDUCTION POWER SUPPLY DEVICE

TECHNICAL FIELD

The present disclosure relates to a magnetic induction power supply device, and more particularly, to a magnetic induction power supply device installed on a transmission line or a distribution line for power acquisition and current sensing using a magnetic induction phenomenon.

BACKGROUND ART

As an interest in a power supply method using a magnetic induction phenomenon is recently increased, various forms of magnetic induction power supply devices are developed.

The power supply device using the magnetic induction method includes a magnetic induction power supply device installed on a power line through which a large amount of current flows, such as a transmission line or a distribution line. The power supply device using the magnetic induction method converts power obtained through the magnetic induction phenomenon into a direct current through the magnetic induction power supply device and supplies the direct current to a load.

The magnetic induction power supply device is installed on the power line for power acquisition or current sensing.

However, when the conventional magnetic induction power supply device approaches the power line in a live wire state for installation, very strong vibration and very high noise occur because a magnetic field is generated. Accordingly, a conventional magnetic induction power supply device has a problem in that an installation task is difficult because noise and vibration occur.

Furthermore, the conventional magnetic induction power supply device generates a magnetic field by the power line in the live wire state. The conventional magnetic induction power supply device has a problem in that separation is difficult due to the influence of the magnetic field generated due to the power line.

DISCLOSURE

Technical Problem

The present disclosure is proposed to solve the above conventional problems, and an object of the present disclosure is to provide a magnetic induction power supply device which can be easily attached to and detached from a power line in a live wire state by changing a mode of a current transformer to a short circuit mode by an operation of a breaking unit installed on a coil.

Technical Solution

In order to achieve the object, a magnetic induction power supply device according to an embodiment of the present disclosure includes a current transformer installed on a power line and including a first core, a second core and one or more coils and a breaking unit connected to at least one of the one or more coils. The breaking unit forms a closed circuit along with the at least one of the one or more coils so that a mode of the current transformer changes into a short circuit mode in which the first core and the second core are able to be separated.

In this case, the current transformer includes a first coil and a second coil wound on at least one of the first core and the second core. The breaking unit may form a closed circuit along with the first coil and the second coil so that a mode of the current transformer changes into the short circuit mode.

In this case, the breaking unit may include a push switch. The breaking unit includes an electronic switch. The magnetic induction power supply device according to an embodiment of the present disclosure may further include a control unit configured to control the electronic switch.

The magnetic induction power supply device according to an embodiment of the present disclosure may further include a rectification unit configured to rectify a voltage induced from at least one of the one or more coils, a switching unit configured to connect at least one of the one or more coils to the rectification unit, and a battery charged with the voltage rectified by the rectification unit and configured to supply the charged voltage to a load. In this case, the rectification unit may directly supply the rectified voltage to the load.

Advantageous Effects

According to the present disclosure, the magnetic induction power supply device has an effect in that it can prevent a magnetic field from being formed when approaching a power line in a live wire state or being installed on the power line by installing the breaking unit on the coil and changing into a short circuit mode upon installation or maintenance.

Furthermore, the magnetic induction power supply device has an effect in that it can prevent the occurrence of vibration and noise and can be easily attached to and detached from the power line by preventing the generation of a magnetic field attributable to the power line in the live wire state.

Furthermore, the magnetic induction power supply device has an effect in that installation and maintenance tasks in the power line in the live wire state can be easily performed because the magnetic induction power supply device can be easily attached to and detached from the power line in the live wire state.

DESCRIPTION OF DRAWINGS

FIG. 1 is a diagram for describing a common magnetic induction power supply device.

FIG. 2 is a diagram for describing a magnetic induction power supply device according to an embodiment of the present disclosure.

FIGS. 3 to 7 are diagrams for describing a breaking unit of FIG. 2.

FIG. 8 is a diagram for describing an operation of the magnetic induction power supply device according to an embodiment of the present disclosure.

FIG. 9 is a diagram for describing a modified example of the magnetic induction power supply device according to an embodiment of the present disclosure.

MODE FOR INVENTION

Hereinafter, the most preferred embodiments of the present disclosure will be described with reference to the accompanying drawings in order to specifically describe the embodiments so that those skilled in the art to which the present disclosure pertains may easily implement the technical spirit of the present disclosure. First, in adding reference numerals to the components of each drawing, it should be noted that the same components have the same reference numerals as much as possible even if they are displayed in different drawings. Furthermore, in describing the present disclosure, when it is determined that the detailed description of the related well-known configuration or function may obscure the gist of the present disclosure, the detailed description thereof will be omitted.

Referring to FIG. 1, a magnetic induction power supply device 100 according to an embodiment of the present disclosure is installed on a power line 10 through which a large amount of current flows, such as a transmission line or a distribution line. The magnetic induction power supply device 100 converts, into a direct current, power obtained through a magnetic induction phenomenon, and supplies the direct current to a load 200. The magnetic induction power supply device 100 may sense a current flowing into the power line 10 in addition to the power acquisition.

Referring to FIG. 2, a magnetic induction power supply device 100 according to an embodiment of the present disclosure includes a current transformer 110, a switching unit 120, a rectification unit 130, a battery 140 and a breaking unit 150.

The current transformer 110 is installed on the power line 10 through which a large amount of current flows, and induces a voltage (or current or power) from the large amount of current flowing into the power line 10. The current transformer 110 is formed to have a structure attached to and detached from the power line 10, such as a clamp type. For example, a coil within the current transformer 110 is bisected to form an upper core 112 and a lower core 114 so that attachment to and detachment from the power line 10 is easy. In this case, the upper core 112 and the lower core 114 are names assigned to easily describe an embodiment of the present disclosure, and the present disclosure is not specifically limited to the terms called the upper part and the lower part. For example, the upper core 112 and the lower core 114 may be named a first core and a second core.

One or more coils are wound on at least one of the upper core 112 and the lower core 114. In this case, FIG. 2 illustrates that a first coil 116 and a second coil 118 are wound on the lower core 114, but the present disclosure is not limited thereto. The first coil 116 and the second coil 118 may be wound on the upper core 112. Furthermore, one of the first coil 116 and the second coil 118 may be wound on one of the upper core 112 and the lower core 114. One of the first coil 116 and the second coil 118 may be wound on the upper core 112, and the other coil of the first coil 116 and the second coil 118 may be wound on the lower core 114.

The first coil 116 is wound on the lower core 114 disposed on the outer circumference of the power line 10. The first coil 116 is composed of a coil wound on the lower core 114 plural times. In this case, a surface of the first coil 116 may be coated with an insulating material. Both ends of the first coil 116 are connected to the switching unit 120.

The second coil 118 is wound on the lower core 114. The second coil 118 is composed of a coil wound on the lower core 114 plural times. The second coil 118 may be wound at a location different from that of the first coil 116 or may be overlapped and wound at the same location as that of the first coil 116. In this case, a surface of the second coil 118 may be coated with an insulating material. Both ends of the second coil 118 are connected to the switching unit 120.

Meanwhile, the first coil 116 and the second coil 118 are formed to have different turns ratios. For example, the first coil 116 may be composed of a coil wound on a core approximately 150 times. The second coil 118 may be composed of a coil wound on a core approximately 50 times.

The switching unit 120 switches based on whether the magnetic induction power supply device 100 is initially driven and a voltage thereof so that at least one of the magnetic induction first coil 116 and second coil 118 is connected in series to the rectification unit 130.

For example, when the magnetic induction power supply device 100 is initially driven, during a set time (e.g., approximately 1 minute), the switching unit 120 switches so that a coil having a small number of turns among the first coil 116 and the second coil 118 is connected in series to the rectification unit 130.

After a lapse of a set time from the initial driving of the magnetic induction power supply device 100, the switching unit 120 switches based on a voltage detected in the magnetic induction power supply device 100 so that at least one of the first coil 116 and the second coil 118 is connected in series to the rectification unit 130.

At this time, when the voltage detected in the magnetic induction power supply device 100 is less than a minimum reference voltage, the switching unit 120 switches so that the first coil 116 and the second coil 118 are connected in series to the rectification unit 130. Accordingly, the switching unit 120 applies, to the rectification unit 130, all voltages induced into the first coil 116 and the second coil 118 so that a voltage equal to or higher than the minimum reference voltage is applied to the rectification unit 130.

When the voltage detected in the magnetic induction power supply device 100 is the minimum reference voltage or more and a maximum reference voltage or less, the switching unit 120 switches so that a coil having a great number of turns among the first coil 116 and the second coil 118 is connected in series to the rectification unit 130, and applies, to the rectification unit 130, a voltage induced from the coil having the great number of turns.

When the voltage detected in the magnetic induction power supply device 100 is more than the maximum reference voltage, the switching unit 120 switches so that a coil having a small number of turns among the first coil 116 and the second coil 118 is connected in series to the rectification unit 130, and applies, to the rectification unit 130, a voltage induced from the single coil having the small number of turns.

The rectification unit 130 converts, into a direct current, a voltage applied by the switching unit 120 by rectifying the voltage. The rectification unit 130 supplies the battery 140 with the voltage rectified into the direct current. The rectification unit 130 may directly supply the load 200 with the voltage rectified into the direct current without the intervention of the battery 140.

The rectification unit 130 may be composed of a full-wave rectification circuit or a half-wave rectification circuit consisting of a plurality of diodes. The rectification unit 130 converts, into a direct current, a voltage induced from at least one of the first coil 116 and the second coil 118 in response to the switching driving of the switching unit 120, and supplies the direct current to the battery 140 or the load 200.

The battery 140 is charged with a voltage (i.e., a direct current voltage) supplied by the rectification unit 130. The battery 140 supplies the charged voltage to the load 200.

The breaking unit 150 includes a switch 152, and is driven by a manipulation of the switch 152 by a worker, thus preventing a magnetic field from being generated in the current transformer 110 installed on the power line 10 in a live wire state or disposed close to the power line 10 in a live wire state. That is, the breaking unit 150 converts a mode of the magnetic current transformer 110 into a short circuit mode by forming a closed circuit along with at least one of the first coil 116 and the second coil 118. Accordingly, the breaking unit 150 minimizes a magnetic field generated in the current transformer 110 due to the power line 10 in the live wire state by reducing a magnetic force flowing into the upper core 112 and the lower core 114.

Accordingly, the magnetic induction power supply device 100 has an effect in that it can prevent a magnetic field from being formed when becoming close to or being installed on the power line 10 in the live wire state.

Furthermore, the magnetic induction power supply device 100 has effects in that it can prevent the occurrence of vibration and noise and can be easily attached to and detached from the power line 10 by preventing the generation of a magnetic field attributable to the power line 10 in the live wire state.

Furthermore, the magnetic induction power supply device 100 has an effect in that installation and maintenance tasks in the power line 10 in the live wire state can be easily performed because the magnetic induction power supply device 100 can be easily attached to and detached from the power line 10 in the live wire state.

The breaking unit 150 is installed on at least one of the first coil 116 and the second coil 118. The breaking unit 150 is driven by a manipulation of a worker, forms a closed circuit along with one of the first coil 116 and the second coil 118, and converts a mode of the current transformer 110 into the short circuit mode. Accordingly, the breaking unit 150 minimizes a magnetic field generated in the current transformer 110 due to the power line 10 in the live wire state by reducing a magnetic force flowing into the cores 112 and 114.

The breaking unit 150 is connected to both ends of the second coil 118 in parallel. The breaking unit 150 operates by a manipulation of a worker and short-circuits the second coil 118. That is, the breaking unit 150 forms a closed circuit between the second coil 118 and the breaking unit 150 by short-circuiting the second coil 118. Accordingly, the breaking unit 150 minimizes a magnetic field generated in the current transformer 110 due to the power line 10 in the live wire state by reducing a magnetic force flowing into the cores 112 and 114.

Referring to FIG. 3, the breaking unit 150 may be connected to both ends of the first coil 116 in parallel. The breaking unit 150 operates by a manipulation of a worker and short-circuits the first coil 116. That is, the breaking unit 150 forms a closed circuit between the first coil 116 and the breaking unit 150 by short-circuiting the first coil 116. Accordingly, the breaking unit 150 minimizes a magnetic field generated in the current transformer 110 due to the power line 10 in the live wire state by reducing a magnetic force flowing into the cores 112 and 114.

Referring to FIG. 4, the breaking unit 150 may include a first breaking unit 150a connected to both ends of the first coil 116 in parallel and a second breaking unit 150b connected to both ends of the second coil 118 in parallel. That is, the first breaking unit 150a forms a closed circuit between the first coil 116 and the breaking unit 150 by short-circuiting the first coil 116. The second breaking unit 150b forms a closed circuit between the second coil 118 and the breaking unit 150 by short-circuiting the second coil 118. Accordingly, the first breaking unit 150a and the second breaking unit 150b minimize a magnetic field generated in the current transformer 110 due to the power line 10 in the live wire state by reducing a magnetic force flowing into the cores 112 and 114.

Meanwhile, in the magnetic induction power supply device 100, when the breaking unit 150 operates, failure of the current transformer 110 or the breaking unit 150 may be caused because an instant high voltage or current flows. In order to prevent this, the breaking unit 150 may additionally include a damping element (not illustrated) such as a resistor for damping. In this case, the damping element (not illustrated) is illustrated as being connected to the switch 152 of the breaking unit 150 in series. In this case, when a mode of the current transformer 110 changes into the short circuit mode, the damping element consumes a current flowing into a closed circuit.

Referring to FIG. 5, the switch 152 is illustrated as being a push switch, that is, a mechanical switch. The push switch may be composed of an alternate type push switch in which ON and OFF are repeated whenever the switch is pressed and a normal open (N/O) type push switch that is turned ON only at the moment when the switch is pressed. The push switch is installed outside the magnetic induction power supply device 100 in a way to be exposed. In this case, a location where the push switch is installed is not limited to the illustrated location. The push switch may be installed at any location where the push switch can be manipulated by a worker.

Referring to FIGS. 6 and 7, when the current transformer 110 is installed on the power line 10 in the live wire state and the state of the switch 152 is an OFF state, it is difficult to separate the upper core 112 and the lower core 114 because a magnetic field is formed by a current flowing into the cores 112 and 114.

In contrast, when the state of the switch 152 is an ON state, a current does not flow into the cores 112 and 114 because a closed circuit is formed between the second coil 118 and the breaking unit 150 (the switch 152). Accordingly, the upper core 112 and the lower core 114 can be easily separated.

At this time, referring to FIG. 8, when the state of the breaking unit 150 is the stop (OFF) state, the magnetic induction power supply device 100 operates in a normal mode, so that a constant output current is output. When the state of the breaking unit 150 changes into the operation (ON) state, a mode of the magnetic induction power supply device 100 changes into the short circuit mode, so that the output current is blocked (i.e., "0").

Meanwhile, referring to FIG. 9, the breaking unit 150 may be composed of an electronic switch. In this case, if the electronic switch is configured as the breaking unit 150, a communication module (not illustrated), a control unit 160, and separate connection equipment need to be additionally installed on the magnetic induction power supply device 100. Accordingly, an additional cost or a mounting space is necessary compared to a case where a mechanical switch is applied, but the same function (i.e., a change of the short circuit mode) as that of the mechanical switch can be performed.

As described above, although the preferred exemplary embodiment according to the present disclosure has been described, it is understood that changes may be made in various forms, and those skilled in the art may practice various changed examples and modified examples without departing from the claims of the present disclosure.

The invention claimed is:
1. A magnetic induction power supply device installed on a power line, comprising:
   a current transformer installed on the power line and comprising a first core, a second core and two or more coils having first and second coils that are wound on at least one of the first core and the second core;

a breaking unit connected to at least one of the two or more coils;

a rectification unit configured to rectify a voltage induced from at least one of the two or more coils: and a switching unit configured to connect at least one of the two or more coils to the rectification unit, wherein both ends of the first coil are connected to the switching unit, and both ends of the second coil are connected to the switching unit, wherein the breaking unit forms a closed circuit along with the at least one of the one or more coils so that a mode of the current transformer changes into a short circuit mode in which the first core and the second core are able to be separated, and wherein the breaking unit comprises:

a first breaking unit connected to both ends of the first coil in parallel and forming a closed circuit along with the first coil so that the mode of the current transformer changes into the short circuit mode; and a second breaking unit connected to both ends of the second coil in parallel and forming a closed circuit along with the second coil so that the mode of the current transformer changes into the short circuit mode, and wherein the first breaking unit and the second breaking unit comprise:

a switch forming a closed circuit along with one of the first coil or the second coil, and a damping element connected to the switch in series to consume a current flowing into the closed circuit.

2. The magnetic induction power supply device of claim 1, wherein the switch is a push switch.

3. The magnetic induction power supply device of claim 1, wherein the switch is an electronic switch, and wherein the magnetic induction power supply device further comprises a control unit configured to control the electronic switch.

4. The magnetic induction power supply device of claim 1, wherein the rectification unit supplies the rectified voltage to a load.

5. The magnetic induction power supply device of claim 1, further comprising a battery charged with the voltage rectified by the rectification unit and configured to supply the charged voltage to a load.

* * * * *